US009983488B2

(12) United States Patent
Li et al.

(10) Patent No.: US 9,983,488 B2
(45) Date of Patent: May 29, 2018

(54) RETICLE SHAPE CORRECTION APPARATUS AND PHOTOLITHOGRAPHY TOOL USING SAME

(71) Applicant: SHANGHAI MICRO ELECTRONICS EQUIPMENT CO., LTD., Shanghai (CN)

(72) Inventors: Lingyu Li, Shanghai (CN); Yulong Li, Shanghai (CN)

(73) Assignee: SHANGHAI MICRO ELECTRONICS EQUIPMENT (GROUP) CO., LTD., Shanghai (CN)

( * ) Notice: Subject to any disclaimer, the term of this patent is extended or adjusted under 35 U.S.C. 154(b) by 0 days. days.

(21) Appl. No.: 15/108,663

(22) PCT Filed: Nov. 28, 2014

(86) PCT No.: PCT/CN2014/092425
§ 371 (c)(1),
(2) Date: Jun. 28, 2016

(87) PCT Pub. No.: WO2015/101121
PCT Pub. Date: Jul. 9, 2015

(65) Prior Publication Data
US 2016/0327873 A1 Nov. 10, 2016

(30) Foreign Application Priority Data

Dec. 31, 2013 (CN) .......................... 2013 1 0752194

(51) Int. Cl.
*G03F 7/20* (2006.01)
*H01L 21/683* (2006.01)

(52) U.S. Cl.
CPC .......... *G03F 7/70741* (2013.01); *G03F 7/707* (2013.01); *G03F 7/70783* (2013.01); *H01L 21/6838* (2013.01)

(58) Field of Classification Search
CPC ............. G03F 7/70733; G03F 7/70741; G03F 7/70691; G03F 7/707; G03F 7/70783; H01L 21/6838
See application file for complete search history.

(56) References Cited

U.S. PATENT DOCUMENTS 6,379,103 B1 * 4/2002 Okugi .................... B65H 5/08
294/64.3
2002/0145714 A1 10/2002 Hirayanagi
(Continued)

FOREIGN PATENT DOCUMENTS

JP 7-136885 A 2/1996
JP 8-55778 A 2/1996
(Continued)

*Primary Examiner* — Steven H Whitesell Gordon
(74) *Attorney, Agent, or Firm* — Muncy, Geissler, Olds & Lowe, P.C.

(57) ABSTRACT

An apparatus for correcting the shape of a reticle, including: suckers; a sucker mounting frame; and a pneumatic control system, wherein the sucker mounting frame is disposed above a reticle stage, the suckers are mounted on a bottom of the sucker mounting frame in a manner of being spaced apart from one another; and the pneumatic control system is configured to control the suckers to retain the reticle by suction or to release the reticle. The suckers are so arranged that they do not block trapezoidal exposure fields of view on the reticle, thereby allowing a light beam to be fully (100%) incident on the reticle, which results in improved exposure efficiency. The apparatus is mounted separately from a photolithography tool by which it is employed, enabling a lower weight load on the reticle. Additionally, the apparatus is not in contact with any component disposed in the photolithography tool and will not introduce additional external vibration to the tool.

16 Claims, 6 Drawing Sheets

(56) References Cited

U.S. PATENT DOCUMENTS

| | | | | |
|---|---|---|---|---|
| 2004/0048405 | A1* | 3/2004 | Hirota | G02F 1/134363 438/29 |
| 2009/0098479 | A1* | 4/2009 | Sykes | G03F 7/70041 430/270.1 |
| 2009/0257033 | A1* | 10/2009 | Nara | G03F 7/70275 355/53 |

FOREIGN PATENT DOCUMENTS

| | | |
|---|---|---|
| JP | 2005-150527 A | 6/2005 |
| TW | 2003-00960 A | 6/2003 |

* cited by examiner

RETICLE SHAPE CORRECTION APPARATUS AND PHOTOLITHOGRAPHY TOOL USING SAME

TECHNICAL FIELD

The present invention relates to the field of integrated circuit (IC) fabrication and, more particularly, to an apparatus for correcting the shape of a reticle. The invention is also directed to a photolithography tool using the apparatus.

BACKGROUND

With increasing enlargement of thin-film transistor (TFT) substrates, the size of reticles used in photolithography equipment for TFT fabrication is accordingly increasing, from the initial 6 inches to 920 mm×800 mm for $5.5^{th}$ generation (G5.5) photolithography equipment and up to 1320 mm×1108 mm for $8.5^{th}$ generation (G8.5) reticles. When such a huge reticle is retained on a reticle stage by suction, its downward bending due to gravity is inevitable, which can be as great as up to over 40 μm. For TFT-fabricating photolithography equipment of the $5.5^{th}$ or more recent generations, the use of field-of-view (FOV) stitching or ultra-large FOV techniques has become an irresistible trend. However, the great impact of reticle warpage on exposure accuracy, in particular, on the focal-depth range of an objective, poses a great challenge to image quality guaranteeing.

One method for reticle warpage correction is to introduce an object-plane adjustment mechanism in the objective, which enables adaptation to gravity-caused reticle deformation. However, this leads to increases in structural complexity of the objective and the addition of a considerable number of movable members, which are not conducive to the reliability of photolithography equipment.

There is another method which uses a vacuum sealing technique in which a glass plate is mounted between the reticle and an illumination system such that the reticle, the reticle stage and the glass plate delimit a space which is configured to communicate with an air evacuation passage and an air introduction passage of a pneumatic device. A pressure in the space can be adjusted to produce an upward force equal to the reticle gravity, which bends the reticle in a direction opposite the direction of the gravity, thereby offsetting the gravitational bending of the reticle. However, the presence of the glass plate affects the performance of the illumination system in exposing the reticle. Moreover, the glass plate itself also experiences deformation caused by its own gravity, which further deteriorates the exposure performance. Further, the reticle, the glass plate and the pneumatic device are arranged on the same frame, which increases vibration and a weight load of the reticle.

SUMMARY OF THE INVENTION

The present invention solves the gravity-caused reticle deformation problem of the prior art by presenting an apparatus for correcting the shape of a reticle.

The above problem is solved by an apparatus according to the present invention, which includes a plurality of suckers, a sucker mounting frame and a pneumatic control system. The sucker mounting frame is disposed above the reticle, the plurality of suckers are mounted on a bottom of the sucker mounting frame in a manner of being spaced apart from one another. The pneumatic control system is configured to control the plurality of suckers to retain the reticle by suction or to release the reticle.

Preferably, the plurality of suckers are fixed on the bottom of the sucker mounting frame by adjustment screw bolts or detachable fasteners.

Preferably, vertical projections of the plurality of suckers on the reticle are external to trapezoidal exposure fields of view on the reticle.

Preferably, the plurality of suckers retain the reticle by suction in a non-contact manner.

Preferably, the pneumatic control system includes: a plurality of pneumatic channels each connected to a corresponding one of the plurality of suckers; and a pressure relief valve, a switching valve and a pressure sensor, arranged in each of the plurality of pneumatic channels.

Preferably, each of the plurality of suckers provides a suction force that is monitorable in real time by a corresponding pressure sensor and is controllable and adjustable by a corresponding pressure relief valve and a corresponding switching valve.

Preferably, the apparatus further includes a mounting plate for tuning a distance from bottom sides of the plurality of suckers to the reticle.

Preferably, the reticle is a large reticle sized at 920 mm×800 mm or larger, i.e., a reticle used in $5.5^{th}$ or a more recent generation of photolithography equipment for TFT fabrication.

The above problem is also solved by a photolithography tool including a light source, an illumination system, a reticle stage, an objective and a wafer stage. The reticle stage is configured to support and move a reticle, and the illumination system is configured to define one or more illuminated fields of view on a plane of the reticle. The photolithography tool further includes an apparatus for correcting the shape of the reticle, including: a sucker mounting frame disposed above the reticle stage; a plurality of suckers arranged on a bottom of the sucker mounting frame; and a pneumatic control system configured to control the plurality of suckers to retain the reticle by suction or to release the reticle. Vertical projections of the plurality of suckers on the plane of the reticle are not overlapped with the one or more illuminated fields of view, and the plurality of suckers retain the reticle by suction in a non-contact manner.

Preferably, the plurality of suckers are arranged in a plurality of rows, in which, a middle row of the plurality of rows has a length greater than a length of a stroke of the reticle and remaining ones of the plurality of rows arranged on both sides of the middle row have a length smaller than the length of the stroke of the reticle.

Preferably, each of the plurality of rows is spaced apart from an adjacent one of the plurality of rows.

Preferably, the pneumatic control system is configured to control the plurality of suckers above the reticle such that the plurality of suckers retain the reticle by suction and to control a suction force provided by each of the plurality of suckers that retains the reticle such that the reticle is subject to suction forces that substantially counterbalance a gravity of the reticle.

Preferably, the pneumatic control system includes: a plurality of pneumatic channels each connected to a corresponding one of the plurality of suckers; and a pressure relief valve, a switching valve and a pressure sensor, arranged in each of the plurality of pneumatic channels.

Preferably, the suction force provided by each of the plurality of suckers that retains the reticle is monitorable by a corresponding pressure sensor and is adjustable by a corresponding pressure relief valve.

Preferably, the sucker mounting frame is not in connection with any of the light source, the illumination system, the reticle stage, the objective and the wafer stage.

Preferably, the reticle has a size of 920 mm×800 mm or larger.

Preferably, the plurality of suckers are fixed on the bottom of the sucker mounting frame by adjustment screw bolts or detachable fasteners.

Preferably, the apparatus further includes a mounting plate for tuning a distance from bottom sides of the suckers to the reticle.

The present invention offers the following advantages over the prior art: the suckers do not block trapezoidal exposure fields of view on the reticle, thereby allowing the full (100%) incidence of a light beam on the reticle, which results in improved exposure efficiency; the suction forces provided by the suckers can effectively reduce a weight load of the reticle and hence prevent gravitational deformation thereof; and the apparatus is independent from, i.e., not in connection or contact with, any of the light source, the illumination system, the reticle stage, the objective and the wafer stage, arranged in the photolithography tool, and thus will not introduce additional external vibration to the tool.

In these figures: 10—reticle shape correction apparatus; 100—suckers; 200—sucker mounting frames; 300—adjustment screw bolts; 400—pneumatic ports; 500—mounting plate; 600—reticle; 610—trapezoidal exposure fields of view; 700—reticle stage; 800—pneumatic control system; 810—pressure relief valve; 820—switching valve; 830—pressure sensor; and 900—pneumatic channel.

DETAILED DESCRIPTION

The above purposes, features and advantages of the present invention will become more apparent from the following description of several specific embodiments of the invention, which is to be read in connection with the accompanying drawings. It is noted that the drawings are provided in a very simplified form not necessarily presented to scale, with the only purpose for convenience and clarity in explaining the embodiments.

Figure 1:
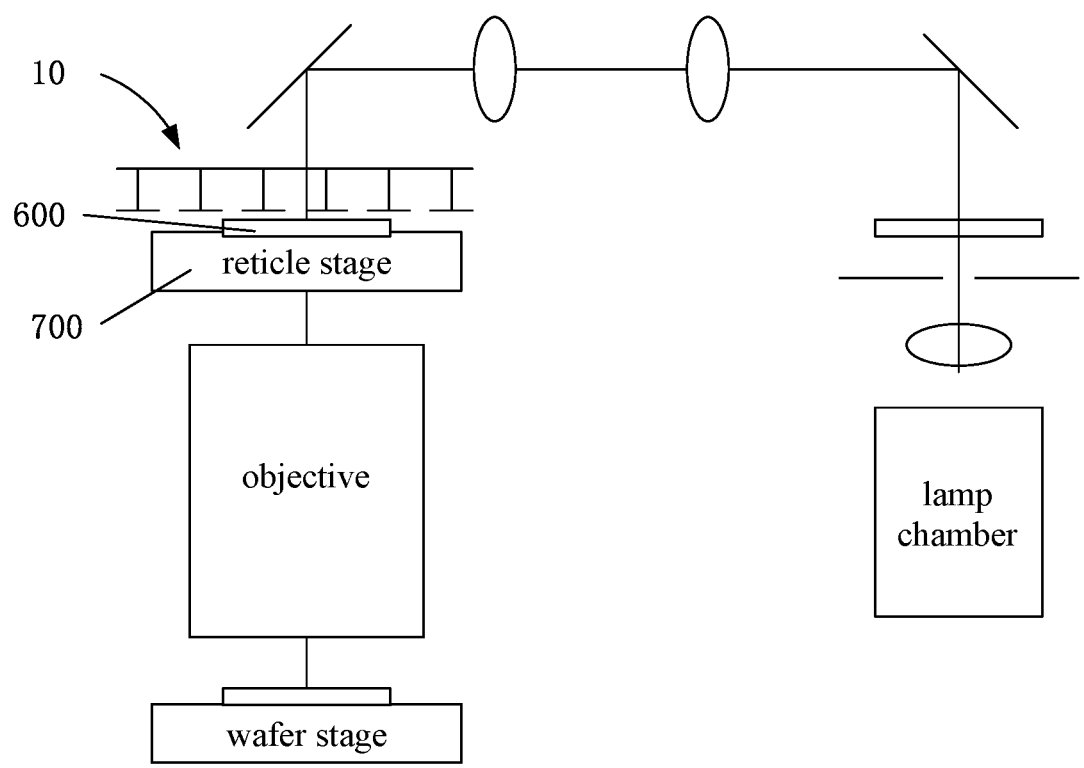
FIG. 1 is a schematic illustration of a photolithography tool in accordance with a specific embodiment of the present invention.
Figure 2:
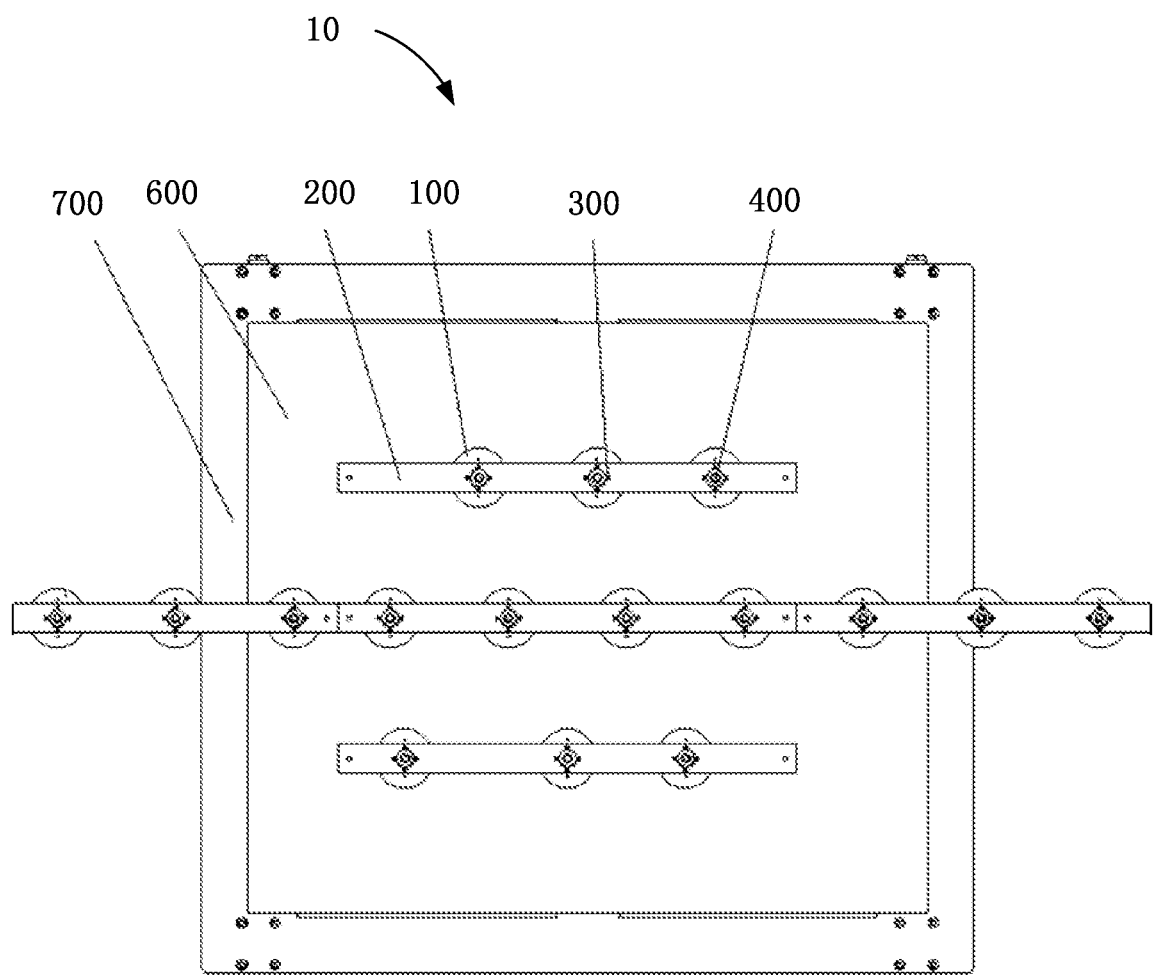
FIG. 2 shows a top view of a reticle shape correction apparatus in accordance with a specific embodiment of the present invention.
Figure 3:
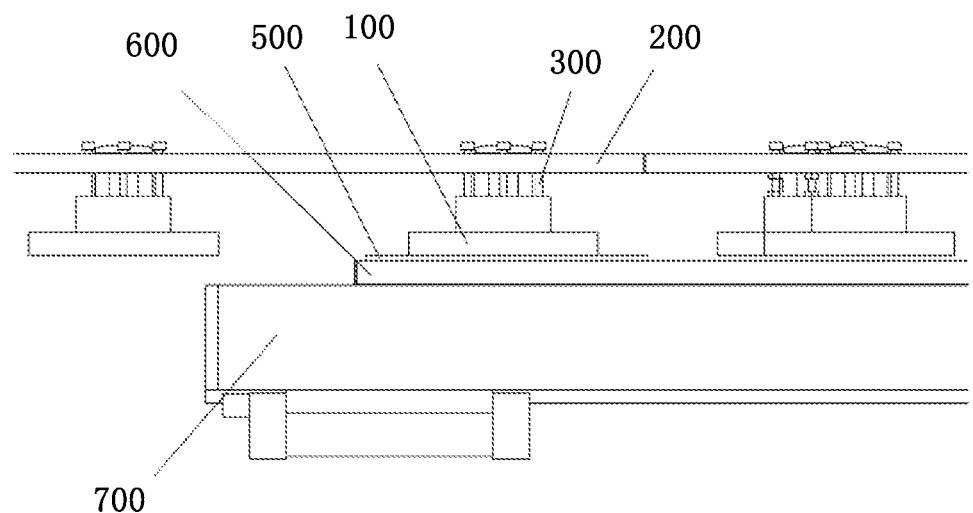
FIG. 3 is a partially enlarged view of a reticle shape correction apparatus in accordance with a specific embodiment of the present invention.
Figure 5:
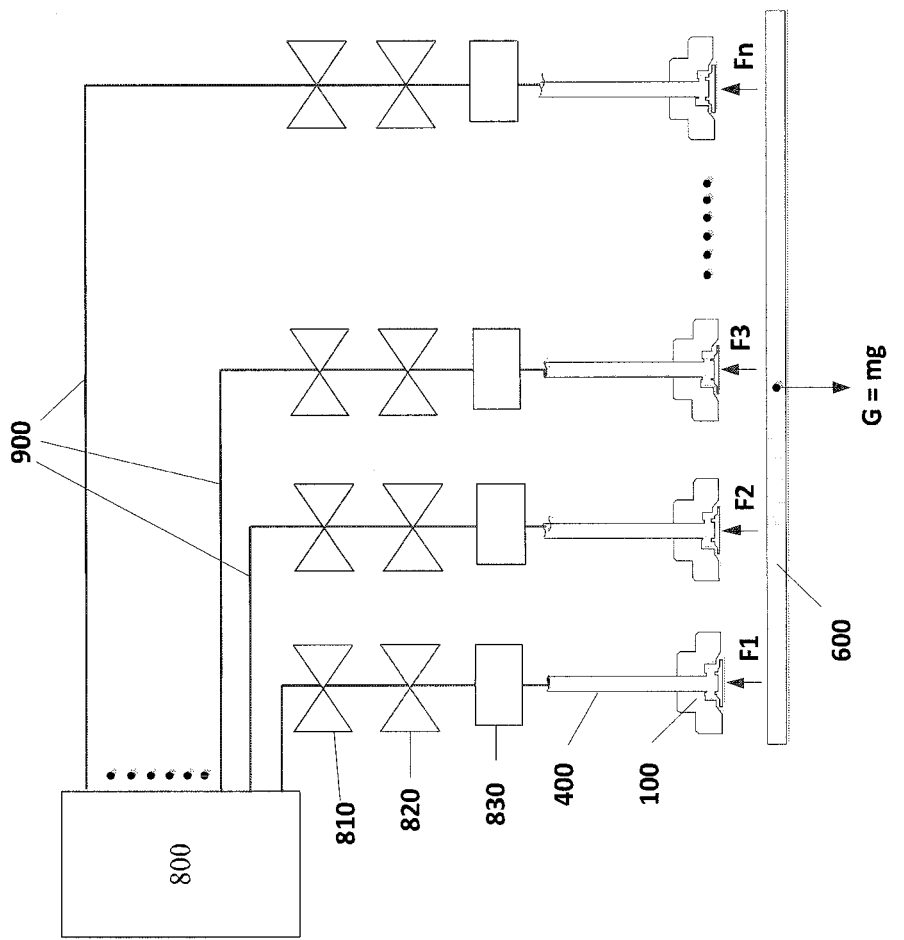
FIG. 5 shows how a reticle shape correction apparatus operates in accordance with a specific embodiment of the present invention.

As shown in FIGS. 1 to 3, an apparatus 10 for correcting the shape of a reticle according to the present invention includes suckers 100, sucker mounting frames 200 and pneumatic control systems 800 (shown in FIG. 5). The sucker mounting frames 200 are disposed above a reticle stage 700, and the suckers 100 are mounted on the bottoms of the sucker mounting frames 200 in such a manner that they are spaced apart from one another and correspond to areas out of trapezoidal exposure fields of view (FOVs) 610 (FIGS. 6 and 7) on the reticle 600. The pneumatic control systems 800 are configured to control motions of the suckers 100 of retaining or releasing the reticle 600. In particular, illumination light is emitted from a lamp chamber and then sequentially passes through lenses, a gradient attenuator, the reticle 600 on the reticle stage 700 and an objective assembly, thereby forming an image on a wafer and a wafer stage. It is a matter of course that it is possible for the illumination system to have multiple illumination light paths and accordingly multiple objectives, and the implementation of the invention is not limited by a specific number of illumination light paths. The suckers 100 are mounted between the reticle 600 and the illumination system. The suckers 100 are so arranged that they do not affect the exposure FOVs on the reticle 600 (referring to FIGS. 6 and 7 for details in this regard), so they have no impact on the quality of exposure of the reticle 600 by the illumination system. Preferably, the suckers 100 are fixed to the bottoms of the sucker mounting frames 200 by adjustment screw bolts 300.

In addition, each sucker 100 has a pneumatic port 400 and is connected to a pneumatic channel 900 via the pneumatic port 400. Each sucker 100 is further connected to a corresponding one of the pneumatic control systems 800 via the pneumatic channel 900. Each pneumatic control system 800 includes a pressure relief valve 810, a pressure sensor 830 and a switching valve 820, which are configured for real-time adjustments of a pressure formed in a corresponding one of the suckers 100. The pneumatic control system 800 further includes a compression power system, namely a compression pump, for providing a driving force to feed a positive-pressure gas into the corresponding pneumatic channel 900. The switching valve 820 is configured to activate or deactivate the sucker 100, and the pressure relief valve 810 is configured to set the pressure in the sucker 100 to a desired stable value. The pressure sensor 830 serves to measure the pressure, thereby achieving real-time control of the sucker 100. It is noted that although the pneumatic control systems 800 for the suckers 100 are all identical, during the shape correction of the reticle 600, not all of the suckers 100 are in operation. Therefore, in order for the real-time control of each sucker 100 to be achieved, the pneumatic control systems 800 can be controlled either automatically or manually.

Figure 4:
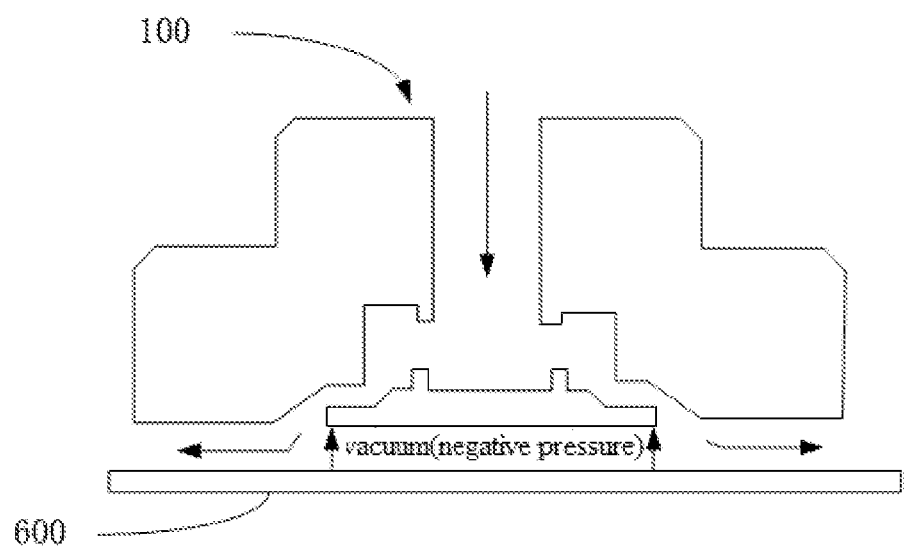
FIG. 4 shows how suckers work in accordance with a specific embodiment of the present invention.

Preferably, the suckers 100 are non-contact suckers, i.e., the suckers 100 not in contact with the reticle 600. In particular, as shown in FIG. 4, each of the non-contact suckers, according to the present invention, defines an annular outlet on the bottom side, through which gas is radially discharged and creates a negative pressure around a center of the bottom side of the sucker 100, thereby retaining the reticle 600. As shown in FIG. 5, the non-contact suckers perform the functions of non-contact transport and attractive retention as defined in the Bernoulli's principle. The multiple non-contact suckers disposed above the reticle 600 can create negative lift forces (F1, F2, F3, . . . , Fn) between the suckers 100 and the reticle 600, which retain the reticle 600 by effectively counterbalancing the gravity (G) of the reticle 600 and preventing its gravitational fall.

Preferably, a mounting plate 500 is further provided for controlling distances from bottom sides of the suckers 100 to the reticle 600. The mounting plate 500 is majorly used during the assembly and mounting of the suckers 100 and functions to homogenize the distances between the suckers 100 and the reticle 600. The mounting plate 500 can be implemented as a tooling plate, the use of which may involve: maintaining the mounting plate 500 stationary on the reticle 600 at a location under the suckers 100; and assembling and mounting each of the suckers 100 with a level of the mounting plate 500 as a reference such that all the mounted suckers are situated at the same level above the reticle 600.

Figure 6:
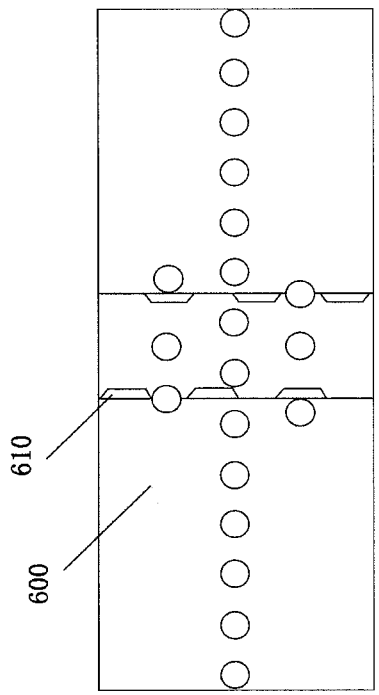
FIGS. 6 and 7 are diagrams showing layouts of suckers in accordance with specific embodiments of the present invention.
Figure 7:
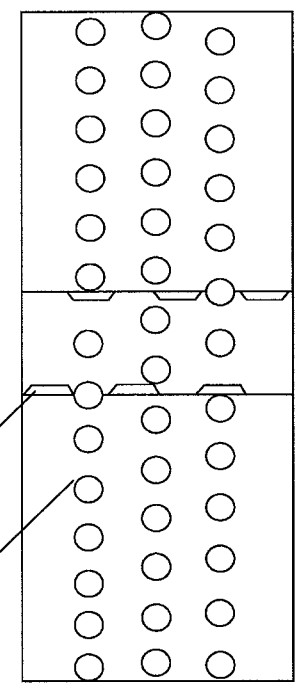

In preferred embodiments, the suckers 100 are arranged in one of the layouts shown in FIGS. 6 and 7, i.e., in three rows. Throughout a process of exposing a reticle pattern, the trapezoidal exposure FOVs 610 are not blocked, with a mask defining the pattern fixed on the reticle 600, and with the suckers 100 fixed on the sucker mounting frames 200 by the adjustment screw bolts 300. A distance from the bottom sides of the suckers 100 to the reticle 600 is adjustable, for example, the distance may be set as 2 mm with a tolerance of 2 μm. Mechanical interfaces between the suckers 100 and the pneumatic control systems 800 are in the form of tubular threads. A force exerted by each sucker 100 is controlled and maintained by the respective pneumatic control system 800.

Figure 8:
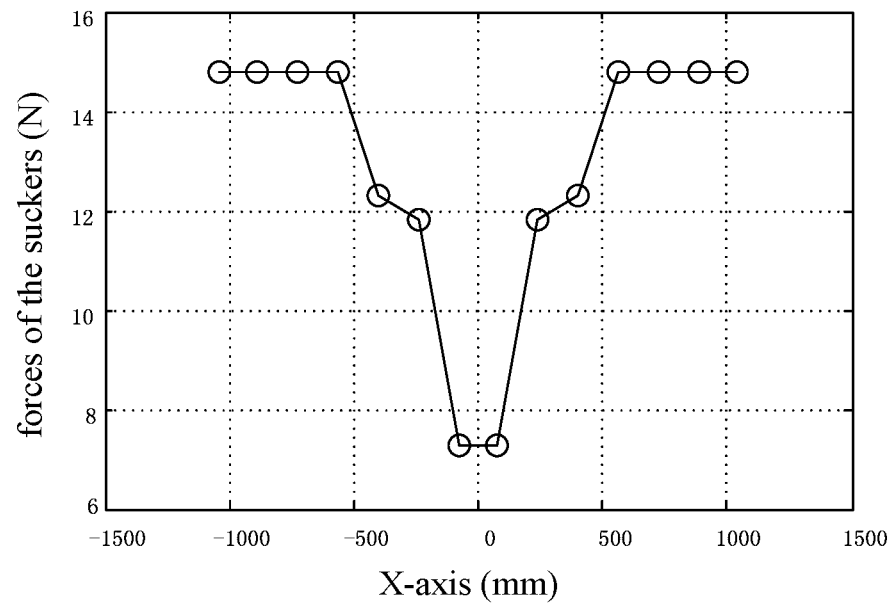
FIG. 8 is a diagram showing the distribution of forces provided by suckers in accordance with a specific embodiment of the present invention.

In the design of the layout of the suckers 100, the trapezoidal exposure FOVs 610 in an entire stroke of the reticle are first taken into account to make sure that the exposure of the pattern is not affected by the positions of the suckers 100. After that, the number of the suckers 100 may be increased or reduced according to practical needs, and in a case of lesser suckers 100 being used, the layout of FIG. 6 can be used, in which a distribution of the forces provided by the suckers 100 is presented in FIG. 8. A force exerted by one of the suckers may be determined by the following factors: 1) the number of adjacent suckers; 2) a location of reticle where the sucker acts on; and 3) operating conditions along the entire stroke in which the reticle is scanned. In one embodiment, the forces of the suckers 100 are determined based on experimental verification and calibration of simulation results. Therefore, the principle of distribution of the suckers 100 according to the present invention is applicable to the shape correction of reticle of any sizes. In case of no limitation in the number of the suckers 100, the layout of FIG. 7 can be used in which three rows of suckers 100, staggered from one another, are arranged above the reticle. The apparatus of the present invention can achieve a good reticle shape correction effect with non-flatness controlled within the range of ±1 μm. Of course, while the apparatus 10 is described above as being used for the shape correction of a large reticle, the present invention is not limited to any specific size of the reticle 600 and can be used to correct the shape of a reticle 600 of any size.

Preferably, the shape correction of the reticle 600 can be accomplished by controlling the suckers 100 based on a simulation analysis. In one example, the reticle 600 is sized at 920 mm×800 mm with an effective pattern area of 750 mm×650 mm and an area of exposure FOVs of 280 mm×650 mm.

Specifically, at first, the suckers 100 of FIG. 6 are numbered (from left to right) as follows:

Row 1: 101, 102, 103;
Row 2: 201, 202, 203, 204, 205, 206, 207, 208, 209, 210, 211, 212, 213, 214; and
Row 3: 301, 302, 303.

Prescribed lift forces for the numbered suckers 100 are summarized in Table 1.

TABLE 1

| Sucker No. | Lift Force (N) |
|---|---|
| 101 | 6.53 |
| 102 | 6.53 |
| 103 | 6.03 |
| 201 | 14.8 |
| 202 | 14.8 |
| 203 | 14.8 |
| 204 | 14.8 |
| 205 | 12.3 |
| 206 | 11.8 |
| 207 | 7.28 |
| 208 | 7.28 |
| 209 | 11.8 |
| 210 | 12.3 |
| 211 | 14.8 |
| 212 | 14.8 |
| 213 | 14.8 |
| 214 | 14.8 |
| 301 | 6.03 |
| 302 | 6.53 |
| 302 | 6.53 |

Figure 9A:
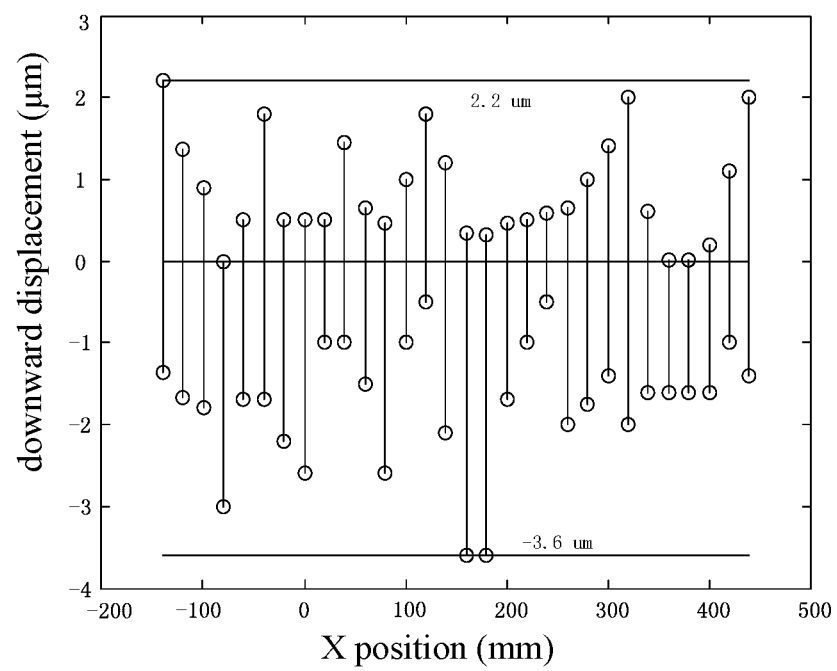
FIGS. 9a and 9b are diagrams showing the results of simulated reticle shape correction in accordance with a specific embodiment of the present invention.
Figure 9B:
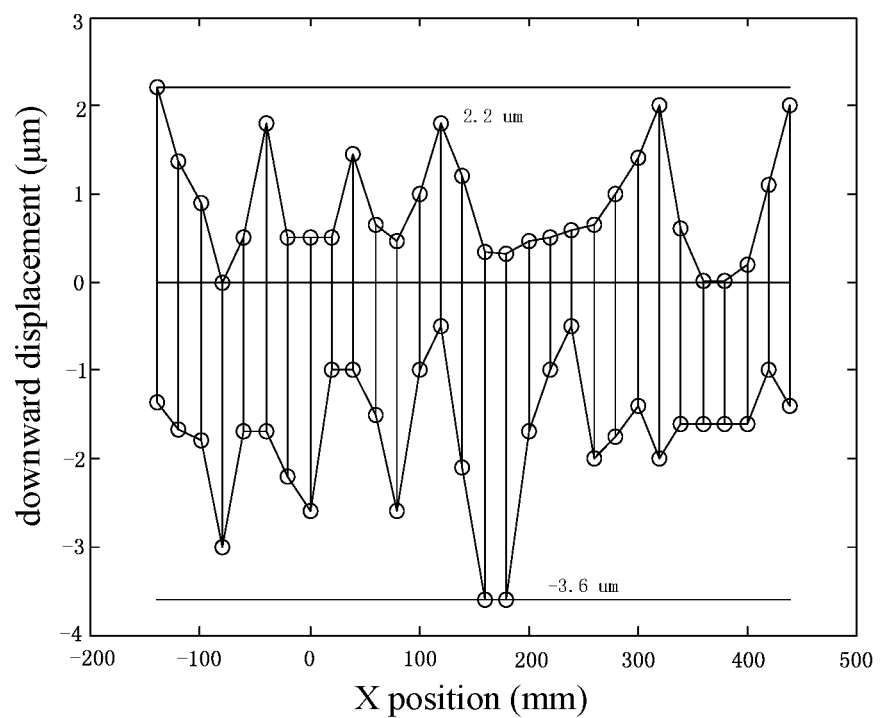

As the simulation analysis took into account the entire stroke of the reticle, the reticle was provided with lift forces by different suckers 100 at corresponding positions in the stroke. During the advancement of the reticle in the stroke, some of the suckers 100 partially overlapped an edge of the reticle. In such partial overlapping cases, actually measured lift forces of the suckers 100 were fed back to software that implemented the simulation analysis. The correction results of the whole reticle scanning process are shown in Table 2 and FIGS. 9a and 9b. In Table 2: the simulation identifiers are designations for the used simulation models and do not have special meanings. The X-positions, measured in mm, represent positions in the entire reticle scanning stroke which is 1200 mm long. As the suckers are arranged in symmetry, it is possible to consider only one half of the stroke, i.e., 600 mm, and the remaining 600 mm produces the same results. Therefore, precisely, the X-positions are positions along the 600 mm long scanning stroke portion. The minimum and maximum downward displacements, measured in μm, are the minimum and maximum values of downward displacements measured at the X-positions, wherein each positive value indicates excessive compensation, and each negative value indicates insufficient compensation.

As apparent from the above description, the retention by the suckers 100 enabled the downward displacements of the reticle 600 to be controlled in the ranges of −3.6-0.35 μm and −0.5-2.2 μm, corresponding to the two positions with the worst compensation results among the positions in the entire scanning/exposure stroke. At one of these positions, the reticle experienced a maximum downward displacement of −3.6 μm and a minimum downward displacement of 0.35 μm (excessive compensation), and at the other position, the reticle experienced a maximum downward displacement of −0.5 μm and a minimum downward displacement of 2.2 μm. If a closed-loop servo control over the wafer stage in the vertical direction had been taken in account, the gravitational downward displacements of the reticle in the exposure FOVs would be controlled in the range of ±2 μm.

TABLE 2

| Simulation Identifier | X-positons | Minimum Downward Displacement | Maximum Downward Displacement |
|---|---|---|---|
| 09-04-01 | −160 | | |
| 09-04-02 | −140 | −1.3531 | 2.2 |
| 09-04-03 | −120 | −1.6768 | 1.37 |
| 09-04-04 | −100 | −1.8 | 0.9 |
| 09-04-05 | −80 | −3 | 0 |
| 09-04-06 | −60 | −1.7 | 0.5 |
| 09-04-07 | −40 | −1.7 | 1.8 |
| 09-04-08 | −20 | −2.2 | 0.5 |
| 09-04-09 | 0 | −2.6 | 0.5 |
| 09-04-10 | 20 | −1 | 0.5 |
| 09-04-11 | 40 | −1 | 1.45 |
| 09-04-12 | 60 | −1.5 | 0.65 |
| 09-04-13 | 80 | −2.6 | 0.4703 |
| 09-04-14 | 100 | −1 | 1 |
| 09-04-15 | 120 | −0.5 | 1.8 |
| 09-04-16 | 140 | −2.1 | 1.2 |
| 09-04-17 | 160 | −3.6 | 0.35 |
| 09-04-18 | 180 | −3.6 | 0.33 |
| 09-04-19 | 200 | −1.7 | 0.456 |
| 09-04-20 | 220 | −1 | 0.5 |
| 09-04-21 | 240 | −0.5 | 0.589 |
| 09-04-22 | 260 | −2 | 0.65 |
| 09-04-23 | 280 | −1.75 | 1 |
| 09-04-24 | 300 | −1.4 | 1.4 |
| 09-04-25 | 320 | −2 | 2 |
| 09-04-26 | 340 | −1.6 | 0.6 |
| 09-04-27 | 360 | −1.6 | 0.02 |
| 09-04-28 | 380 | −1.6 | 0.02 |
| 09-04-29 | 400 | −1.6 | 0.2 |
| 09-04-30 | 420 | −1 | 1.1 |
| 09-04-31 | 440 | −1.4 | 2 |

In summary, the present invention relates to an apparatus for correcting the shape of a large reticle, including: suckers 100; sucker mounting frames 200; and pneumatic control systems 800, wherein the sucker mounting frames 200 are disposed above a reticle stage 700; the suckers 100 are mounted on the bottoms of the sucker mounting frames 200 in such a manner that they are spaced apart from one another; and the pneumatic control systems 800 are configured to control motions of the suckers 100 of retaining by suction or releasing the reticle 600. Compared to the prior art, the present invention offers the following advantages:

1. the suckers 100 do not block the trapezoidal exposure FOVs 610 of the reticle 600, thereby allowing the full (100%) incidence of a light beam on the reticle, which results in improved exposure efficiency;

2. the suckers 100 are controlled independently of one another by the respective pneumatic control systems 800, which is conducive to the correction of reticle bending;

3. it is mounted separately from a photolithography tool by which it is employed, enabling a lower weight load on the reticle;

4. it is not in contact with any component disposed in the photolithography tool and will not introduce additional external vibration to the photolithography tool;

5. gas flows created by the suckers 100 dissipate heat generated on the reticle surface due to irradiation of light from a mercury lamp and thus reduce thermal deformation of the reticle, which lead to an improvement in imaging quality;

6. the gas flows clear possible particles or other obstacles from the reticle, thereby enhancing the exposure accuracy.

It is apparent that those skilled in the art can make various modifications and variations to the present invention without departing from the spirit and scope of the invention. Accordingly, it is intended that the present invention embraces all such modifications and variations as fall within the scope of the appended claims and equivalents thereof.

What is claimed is:

1. An apparatus for correcting the shape of a reticle, comprising:
    a plurality of suckers;
    a sucker mounting frame; and
    a pneumatic control system, wherein the sucker mounting frame is disposed above the reticle; the plurality of suckers are mounted on a bottom of the sucker mounting frame in a manner of being spaced apart from one another; and the pneumatic control system is configured to control the plurality of suckers to retain the reticle by suction or to release the reticle,
    wherein the pneumatic control system comprises: a plurality of pneumatic channels each connected to a corresponding one of the plurality of suckers; and a pressure relief valve, a switching valve and a pressure sensor, arranged in each of the plurality of pneumatic channels.

2. The apparatus of claim 1, wherein the plurality of suckers are fixed on the bottom of the sucker mounting frame by adjustment screw bolts or detachable fasteners.

3. The apparatus of claim 1, wherein vertical projections of the plurality of suckers on the reticle are external to trapezoidal exposure fields of view of the reticle.

4. The apparatus of claim 1, wherein the plurality of suckers retain the reticle by suction in a non-contact manner.

5. The apparatus of claim 1, wherein each of the plurality of suckers provides a suction force that is monitorable in real time by a corresponding pressure sensor and is controllable and adjustable by a corresponding pressure relief valve and a corresponding switching valve.

6. The apparatus of claim 1, further comprising a mounting plate for tuning a distance from bottom sides of the plurality of suckers to the reticle.

7. The apparatus of claim 1, wherein the reticle has a size of 920 mm×800 mm or larger.

8. A photolithography tool comprising a light source, an illumination system, a reticle stage, an objective and a wafer stage, the reticle stage configured to support and move a reticle, the illumination system configured to define one or more illuminated fields of view on a plane of the reticle, wherein the photolithography tool further comprises an apparatus for correcting the shape of the reticle, comprising:
    a sucker mounting frame disposed above the reticle stage;
    a plurality of suckers arranged on a bottom of the sucker mounting frame; and
    a pneumatic control system configured to control the plurality of suckers to retain the reticle by suction or to release the reticle,
    wherein vertical projections of the plurality of suckers on the plane of the reticle are not overlapped with the one or more illuminated fields of view; and the plurality of suckers retain the reticle by suction in a non-contact manner,
    wherein the pneumatic control system comprises: a plurality of pneumatic channels each connected to a corresponding one of the plurality of suckers; and a pressure relief valve, a switching valve and a pressure sensor, arranged in each of the plurality of pneumatic channels.

9. The photolithography tool of claim 8, wherein the plurality of suckers are arranged in a plurality of rows, in which, a middle row of the plurality of rows has a length greater than a length of a stroke of the reticle and remaining ones of the plurality of rows arranged on both sides of the middle row have a length smaller than the length of the stroke of the reticle.

10. The photolithography tool of claim 9, wherein each of the plurality of rows is spaced apart from an adjacent one of the plurality of rows.

11. The photolithography tool of claim 8, wherein the pneumatic control system comprises: a plurality of pneumatic channels each connected to a corresponding one of the plurality of suckers; and a pressure relief valve, a switching valve and a pressure sensor, arranged in each of the plurality of pneumatic channels.

12. The photolithography tool of claim 8, wherein the suction force provided by each of the plurality of suckers that retains the reticle is monitorable by a corresponding pressure sensor and is adjustable by a corresponding pressure relief valve.

13. The photolithography tool of claim 8, wherein the sucker mounting frame is not in connection with any of the light source, the illumination system, the reticle stage, the objective and the wafer stage.

14. The photolithography tool of claim 8, wherein the reticle has a size of 920 mm×800 mm or larger.

15. The photolithography tool of claim 8, wherein the plurality of suckers are fixed on the bottom of the sucker mounting frame by adjustment screw bolts or detachable fasteners.

16. The photolithography tool of claim 8, wherein the apparatus further comprises a mounting plate for tuning a distance from bottom sides of the plurality of suckers to the reticle.

* * * * *